(12) United States Patent
Yokoyama et al.

(10) Patent No.: US 8,785,926 B2
(45) Date of Patent: Jul. 22, 2014

(54) SEMICONDUCTOR DEVICE

(71) Applicants: Masatoshi Yokoyama, Tochigi (JP);
Tsutomu Murakawa, Isehara (JP);
Kenichi Okazaki, Tochigi (JP);
Masayuki Sakakura, Isehara (JP);
Takuya Matsuo, Osaka (JP); Yosuke Kanzaki, Osaka (JP); Hiroshi Matsukizono, Osaka (JP); Yoshitaka Yamamoto, Yamatokoriyama (JP)

(72) Inventors: Masatoshi Yokoyama, Tochigi (JP);
Tsutomu Murakawa, Isehara (JP);
Kenichi Okazaki, Tochigi (JP);
Masayuki Sakakura, Isehara (JP);
Takuya Matsuo, Osaka (JP); Yosuke Kanzaki, Osaka (JP); Hiroshi Matsukizono, Osaka (JP); Yoshitaka Yamamoto, Yamatokoriyama (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/860,879

(22) Filed: Apr. 11, 2013

(65) Prior Publication Data
US 2013/0270554 A1  Oct. 17, 2013

(30) Foreign Application Priority Data

Apr. 17, 2012 (JP) ................................. 2012-093513

(51) Int. Cl.
*H01L 29/10* (2006.01)
(52) U.S. Cl.
USPC .................................. 257/43; 257/E31.032
(58) Field of Classification Search
USPC ............................................ 257/43, E31.032
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Trung Q Dang
(74) *Attorney, Agent, or Firm* — Eric J. Robinson; Robinson Intellectual Property Law Office, P.C.

(57) ABSTRACT

The semiconductor conductor device includes a gate electrode 106, an oxide semiconductor film 110, a source electrode 114a and a drain electrode 114b, and a channel region formed in the oxide semiconductor film. The channel region is formed between a first side surface 214a of the source electrode and a second side surface 214b of the drain electrode opposite to the first side surface 214a. The oxide semiconductor film has a side surface which overlaps with the gate electrode, which has a first high resistance region positioned between a first region 206a that is the nearest to one end 314a of the first side surface 214a and a second region 206b that is the nearest to one end 314b of the second side surface 214b. The first high resistance region has a corrugated side surface or the like.

18 Claims, 12 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,247,813 B2 * | 8/2012 | Koyama et al. | 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0175608 A1 | 7/2012 | Yamazaki | |
| 2012/0175609 A1 | 7/2012 | Yamazaki | |
| 2012/0175610 A1 | 7/2012 | Yamazaki | |
| 2012/0175625 A1 | 7/2012 | Yamazaki | |
| 2012/0178224 A1 | 7/2012 | Yamazaki | |
| 2012/0178249 A1 | 7/2012 | Yamazaki | |
| 2013/0009219 A1 * | 1/2013 | Yamazaki et al. | 257/288 |
| 2013/0200366 A1 * | 8/2013 | Koyama et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-299913 A | 11/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Device Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

(56) References Cited

OTHER PUBLICATIONS

Nakamura.M et al., "The phase relations in the In2O3-Ga2ZnO4-ZnO system at 1350°C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D at al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of The SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu, Or Zn] at Temperatures over 1000°C.,", Journal of Solid State Chemistry, 1985, vol. 60, pp. 382-384.

Kitzerow.H et al "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The present invention relates to a semiconductor device including an oxide semiconductor. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as an EL display device.

2. Description of the Related Art

A technique by which a transistor is formed using a semiconductor thin film formed over a substrate has attracted attention. The transistor is applied to a wide range of electronic devices such as a liquid crystal display device. A silicon-based semiconductor material has been widely known as a material for a semiconductor thin film applicable to a transistor. Besides, an oxide semiconductor has attracted attention.

FIG. 12 is a top view of a bottom-gate transistor in which IGZO (In—Ga—Zn—O) is used as an oxide semiconductor. This transistor includes a gate insulating film (not shown) formed over a gate electrode 1001, an oxide semiconductor film 1002 which is formed using IGZO over the gate insulating film, and a source electrode 1003 and a drain electrode 1004 which are formed over the oxide semiconductor film 1002 (for example, see Patent Document 1).

FIG. 13 shows Id (drain current)-Vg (gate voltage) curves of the transistor shown in FIG. 12 which are obtained before and after GBT (Gate Bias Temperature) stress test. The broken line shows the Id-Vg curve before the GBT stress test; and the solid line shows the Id-Vg curve after the GBT stress test.

In the transistor shown in FIG. 12, because an entire end region of the oxide semiconductor film 1002 overlaps with the gate electrode 1001, stress is generated in the end region of the oxide semiconductor film 1002 due to an electric field by application of negative voltage to the gate electrode 1001 when the GBT stress test is performed. Thus, n-type conductivity of the end region of the oxide semiconductor film 1002 is easily made. Accordingly, a parasitic channel is generated in the end region of the oxide semiconductor film 1002 and a leakage path is formed between the source electrode 1003 and the drain electrode 1004, which results in a hump in the Id-Vg curve as shown in FIG. 13. In the circuit using the above transistor, the generation of the hump has adverse effects that voltage in the circuit cannot be retained, current consumption is increased, and the like. Note that "hump" means that the Id increases in the Id-Vg curve in stages.

The reason that the end region of the oxide semiconductor film 1002 becomes n-type is as follows. The oxide semiconductor film 1002 is activated by generation of electric field stress in the oxide semiconductor film 1002, and its reactivity is enhanced. In particular, when the oxide semiconductor film 1002 is formed using a photolithography process and an etching process in manufacturing the transistor, a side surface of the end region of the oxide semiconductor film 1002 is directly exposed to an etching atmosphere such as plasma although a top surface of the oxide semiconductor film 1002 is protected by a photoresist layer. Thus, the side surface of the oxide semiconductor film 1002 is damaged in the process and is easily contaminated by an impurity. As a result, the end region of the oxide semiconductor film 1002 is more easily activated compared to the other portion of the oxide semiconductor film 1002, thereby being likely to become n-type by the GBT stress test.

REFERENCE

Patent Document

[Patent Document 1] Japanese Published Patent Application No. 2007-299913

SUMMARY OF THE INVENTION

An object of one embodiment of the present invention is to provide a semiconductor device in which generation of a parasitic channel on a side surface of an oxide semiconductor film that is an active layer is suppressed.

One embodiment of the present invention is a semiconductor device including a gate electrode, an oxide semiconductor film, a source electrode and a drain electrode, and a channel region formed in the oxide semiconductor film. The channel region is formed between a first side surface of the source electrode and a second side surface of the drain electrode which is opposite to the first side surface. The oxide semiconductor film has a side surface which overlaps with the gate electrode. The side surface of the oxide semiconductor film which overlaps with the gate electrode has a first high resistance region positioned between a first region that is the nearest to one end of the first side surface and a second region that is the nearest to one end of the second side surface. The first high resistance region has at least one of a corrugated side surface, a waved side surface, a jagged side surface, and a side surface where a projected portion and a depressed portion are alternately arranged so that the length of the side surface which overlaps with the gate electrode is increased.

According to the above embodiment of the present invention, the oxide semiconductor film has the side surface which overlaps with the gate electrode, and the side surface has the first high resistance region positioned between the first region that is the nearest to the one end of the first side surface and the second region that is the nearest to the one end of the second side surface, whereby generation of a parasitic channel on the side surface of the oxide semiconductor film can be suppressed even in the case where voltage is applied to the gate electrode.

One embodiment of the present invention is a semiconductor device including a gate electrode, a gate insulating film formed over the gate electrode, an oxide semiconductor film formed over the gate insulating film, a source electrode and a drain electrode which are formed so as to be in contact with the oxide semiconductor film, and a channel region formed in the oxide semiconductor film. The channel region is formed between a first side surface of the source electrode and a second side surface of the drain electrode which is opposite to the first side surface. The oxide semiconductor film has a side surface which overlaps with the gate electrode. The side surface of the oxide semiconductor film which overlaps with the gate electrode has a first high resistance region positioned between a first region that is the nearest to one end of the first side surface and a second region that is the nearest to one end of the second side surface. The first high resistance region has at least one of a corrugated side surface, a waved side surface, a jagged side surface, and a side surface where a projected portion and a depressed portion are alternately arranged so that the length of the side surface which overlaps with the gate electrode is increased.

In one embodiment of the present invention, the side surface of the oxide semiconductor film which overlaps with the gate electrode has a second high resistance region positioned between a third region that is the nearest to the other end of the first side surface and a fourth region that is the nearest to the other end of the second side surface, and the second high resistance region may have at least one of a corrugated side surface, a waved side surface, a jagged side surface, and a side surface where a projected portion and a depressed portion are alternately arranged so that the length of the side surface which overlaps with the gate electrode is increased.

In one embodiment of the present invention, the first high resistance region may be a continuous region from the first region to the second region.

In one embodiment of the present invention, the second high resistance region may be a continuous region from the third region to the fourth region.

In one embodiment of the present invention, the entire side surfaces of the oxide semiconductor film, which overlap with the gate electrode, are high resistance regions, each of which may have at least one of a corrugated side surface, a waved side surface, a jagged side surface, and a side surface where a projected portion and a depressed portion are alternately arranged so that the lengths of the side surfaces which overlap with the gate electrode are increased.

In one embodiment of the present invention, the oxide semiconductor film may be a film containing an oxide of one or more elements selected from indium, zinc, gallium, and tin.

In one embodiment of the present invention, the oxide semiconductor film may include a crystal portion where a c-axis is aligned in a direction parallel to a normal vector of a surface where the oxide semiconductor film is formed.

A semiconductor device in which generation of a parasitic channel on a side surface of an oxide semiconductor film that is an active layer is suppressed can be provided by application of one embodiment of the present invention.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiments.

Note that both a source electrode and a drain electrode in a transistor are connected to an oxide semiconductor film. Current flows in accordance with a potential difference between the source electrode and the drain electrode when voltage is applied to a gate electrode; therefore, the source electrode and the drain electrode may be interchanged depending on an operation, and in that case it may be difficult to identify the positions of the source electrode and the drain electrode. Thus, when a structure of the transistor is described, a source electrode and a drain electrode may be interchanged.

Embodiment 1

⟨Bottom Gate Top Contact-Channel Etch Structure⟩

Figure 1A:
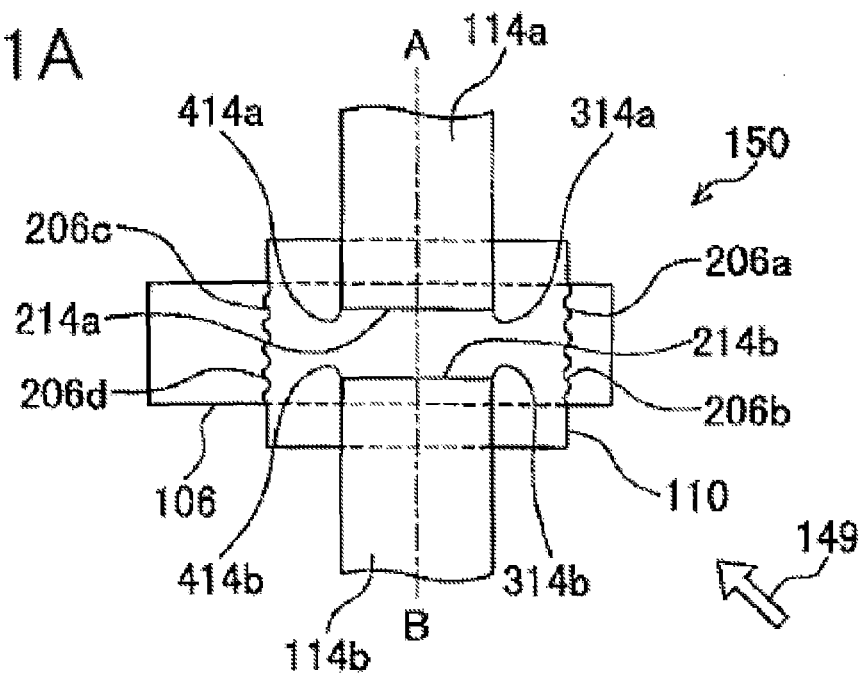
FIG. 1A is a plan view of a semiconductor device according to one embodiment of the present invention.
Figure 1B:
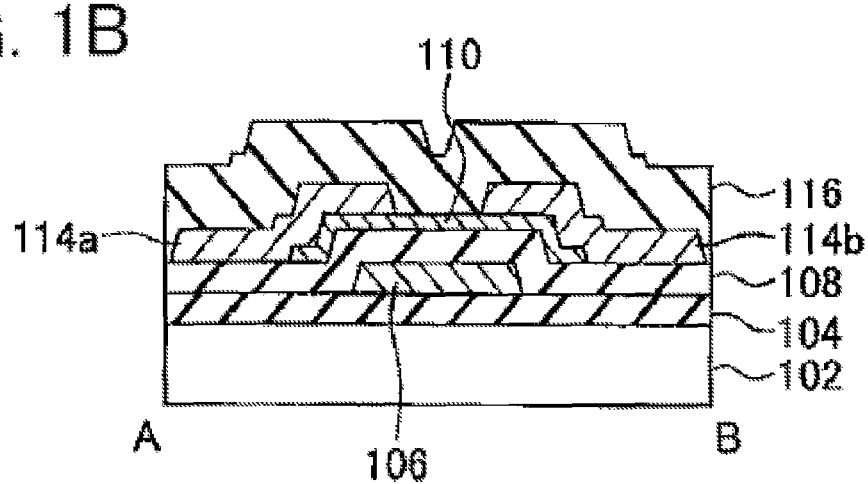
FIG. 1B is a cross-sectional view taken along line A-B shown in FIG. 1A.
Figure 2:
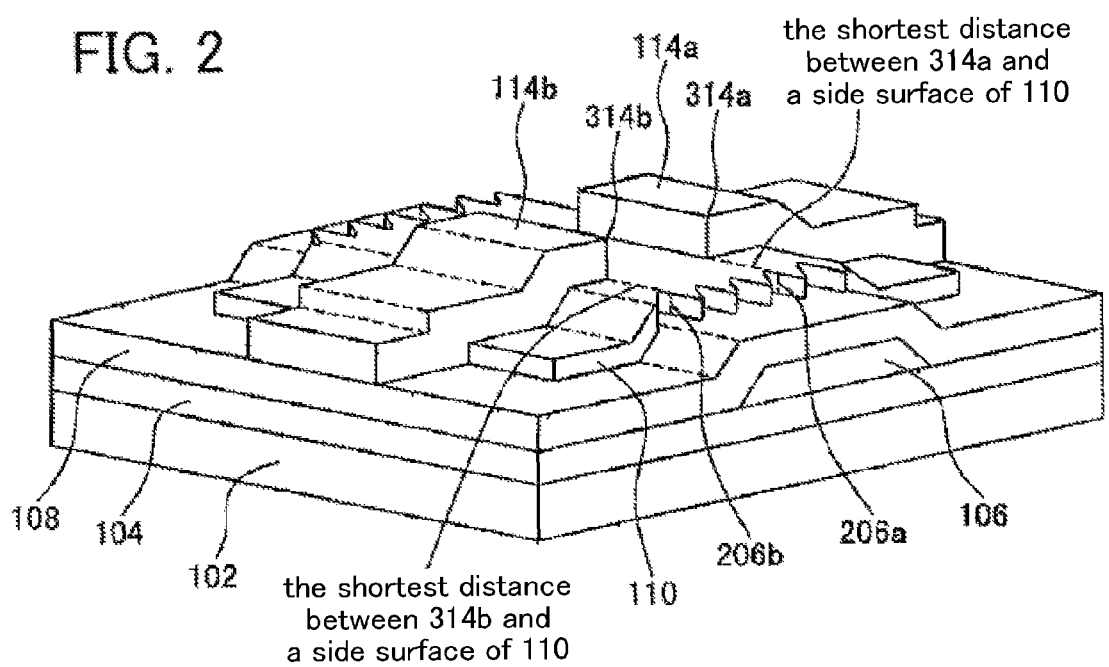
FIG. 2 is a perspective view of the semiconductor device shown in FIG. 1A, which is seen from the direction of arrow 149.

FIG. 1A is a plan view of a semiconductor device according to one embodiment of the present invention, and FIG. 1B is a cross-sectional view taken along line A-B shown in FIG. 1A. FIG. 2 is a perspective view of the semiconductor device shown in FIG. 1A, which is seen from the direction of arrow 149.

The semiconductor device includes a transistor 150 having a bottom-gate structure (also referred to as an inverted staggered structure). Note that in FIG. 1A, some components of the transistor 150 (e.g., a gate insulating film 108 and the like) are not illustrated for simplification.

As illustrated in FIG. 1B, a base insulating film 104 is formed over a substrate 102, and a gate electrode 106 is formed over the base insulating film 104. The gate insulating film 108 is formed over the base insulating film 104 and the gate electrode 106. An oxide semiconductor film 110 having a channel region is formed over the gate insulating film 108. In Embodiment 1, the oxide semiconductor film 110 is an oxide semiconductor film using an IGZO.

The oxide semiconductor film 110 is provided in a position that is in contact with the gate insulating film 108 and overlaps with the gate electrode 106. A source electrode 114a and a drain electrode 114b are formed over the oxide semiconductor film 110 and the gate insulating film 108. The source electrode 114a and the drain electrode 114b are electrically connected to the oxide semiconductor film 110. Note that the source electrode 114a and the drain electrode 114b that are electrically connected to the oxide semiconductor film 110 may be provided between the oxide semiconductor film 110 and the gate insulating film 108.

As shown in FIG. 1A, the channel region of the oxide semiconductor film 110 is formed between a first side surface 214a of the source electrode 114a and a second side surface 214b of the drain electrode 114b which is opposite to the first side surface 214a.

The oxide semiconductor film 110 has side surfaces which overlap with the gate electrode 106 and side surfaces which do not overlap with the gate electrode 106. Note that in this specification, the side surface of the oxide semiconductor film means a side surface of the periphery of the oxide semiconductor film, where process damage, impurity contamination, or the like in etching the oxide semiconductor film is caused.

The gate electrode 106 is arranged so as to extend to an opposite side that is opposite to one side of the oxide semiconductor film 110 having an upper surface of a quadrangular shape. The side surfaces of the oxide semiconductor film 110 which overlap with the gate electrode 106 are side surfaces formed on two sides of the quadrangular shape opposite to each other (see FIG. 1A).

First and second high resistance regions are formed in the side surfaces of the oxide semiconductor film 110 which overlap with the gate electrode 106. The first and the second high resistance regions each include at least one of a corrugated side surface, a waved side surface, a jagged side surface, and a side surface where a projected portion and a depressed portion are alternately arranged so that the lengths of the side surfaces are increased.

The first high resistance region includes a side surface positioned between a first region 206a that is the nearest to one end 314a of the first side surface 214a and a second region 206b that is the nearest to one end 314b of the second side surface 214b (see FIG. 1A and FIG. 2). Note that the first high resistance region is preferably a continuous region from the first region 206a to the second region 206b.

The second high resistance region includes a side surface positioned between a third region 206c that is the nearest to the other end 414a of the first side surface 214a and a fourth region 206d that is the nearest to the other end 414b of the second side surface 214b. Note that the second high resistance region is preferably a continuous region from the third region 206c to the fourth region 206d.

In this manner, the transistor 150 having a bottom-gate structure is formed over the substrate 102. Further, an interlayer insulating film 116 and a planarization insulating film (not shown) may be provided over the transistor 150. In detail, the interlayer insulating film 116 is provided over the source electrode 114a and the drain electrode 114b, and the planarization insulating film is provided over the interlayer insulating film 116.

According to this embodiment, even in the case where voltage is applied to the gate electrode 106 and a parasitic channel is generated on the side surfaces of the oxide semiconductor film 110 which overlap with the gate electrode 106, current is less likely to flow because channel resistance is made high by the formation of the first and the second high resistance regions. Consequently, the parasitic channel can be prevented from occurring on the side surfaces of the oxide semiconductor film 110, and electric characteristics of parasitic transistors generated in the side surfaces can be almost ignored. Thus, with the use of the above-described transistor, the adverse effects that voltage in the current cannot be retained, current consumption is increased, and the like can be reduced.

[Detailed Description of Oxide Semiconductor Film 110]

Note that the oxide semiconductor film 110 may have an amorphous structure or a polycrystalline structure. Alternatively, the oxide semiconductor film 110 may be a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film).

Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Change and variation in threshold voltages can be suppressed. Thus, the transistor has high reliability.

In a crystal part or a crystalline oxide semiconductor film, defects in the bulk can be further reduced. Further, when the surface flatness of the crystal part or the crystalline oxide semiconductor film is enhanced, a transistor including the oxide semiconductor film can have higher field-effect mobility than a transistor including an amorphous oxide semiconductor film. In order to improve the surface flatness of the oxide semiconductor film, the oxide semiconductor film is preferably formed over a flat surface. Specifically, the oxide semiconductor film may be formed over a surface with the average surface roughness ($R_a$) of less than or equal to 0.15 nm, preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a designated surface" and is defined by the formula below.

$$R_a = \frac{1}{S_0} \int_{y_1}^{y_2} \int_{x_1}^{x_2} |f(x, y) - Z_0| dx\, dy \quad \text{[Formula 1]}$$

In Formula 1, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

For the oxide semiconductor film, an oxide semiconductor having a wider band gap than that of silicon, i.e., 1.1 eV, is preferably used. For example, an In—Ga—Zn-based metal oxide having a band gap of about 3.15 eV, indium oxide having a band gap of about 3.0 eV, indium tin oxide having a band gap of about 3.0 eV, indium gallium oxide having a band gap of about 3.3 eV, indium zinc oxide having a band gap of about 2.7 eV, tin oxide having a band gap of about 3.3 eV, zinc oxide having a band gap of about 3.37 eV, or the like can be preferably used. With the use of such a material, the off-state current of the transistor can be kept extremely low.

An oxide semiconductor used for the oxide semiconductor film preferably contains at least one selected from the group consisting of indium (In), zinc (Zn), and gallium (Ga). In particular, In and Zn are preferably contained. As a stabilizer for reducing a variation in electrical characteristics among transistors including the oxide semiconductor, tin (Sn) is preferably contained.

For example, as the oxide semiconductor, any of the following can be used: indium oxide; tin oxide; zinc oxide; a two-component metal oxide such as an In—Zn-based metal oxide, a Sn—Zn-based metal oxide, or In—Ga-based metal oxide; a three-component metal oxide such as an In—Ga—Zn-based metal oxide (also referred to as IGZO), In—Sn—Zn-based metal oxide, Sn—Ga—Zn-based metal oxide; and a four-component metal oxide such as an In—Sn—Ga—Zn-based metal oxide.

Here, an In—Ga—Zn-based metal oxide means a metal oxide whose main components are In, Ga, and Zn, and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ (n>0, n is a natural number) may be used.

For example, an In—Ga—Zn-based metal oxide with an atomic ratio where In:Ga:Zn=1:1:1, In:Ga:Zn=3:1:2, or In:Ga:Zn=2:1:3, or an oxide whose atomic ratio is in the neighborhood of the above compositions may be used.

It is preferable that an impurity such as hydrogen or water be contained in the oxide semiconductor film as little as possible in the formation step of the oxide semiconductor film. For example, it is preferable that the substrate be preheated in a preheating chamber of a sputtering apparatus as pretreatment for formation of the oxide semiconductor film so that an impurity such as hydrogen or water adsorbed to the substrate is eliminated and removed. Then, the oxide semiconductor film is preferably formed in a film formation chamber from which remaining water is removed.

In order to remove water in the preheating chamber and the film formation chamber, an entrapment vacuum pump, for example, a cryopump, an ion pump, or a titanium sublimation pump is preferably used. Further, an evacuation unit may be a turbo pump provided with a cold trap. From the preheating chamber and the film formation chamber which is evacuated with a cryopump, a hydrogen atom, a compound containing a hydrogen atom such as water ($H_2O$) (preferably, also a compound containing a carbon atom), and the like are removed, whereby the concentration of an impurity such as hydrogen or water in the oxide semiconductor film can be reduced.

Note that an In—Ga—Zn-based metal oxide film is formed as the oxide semiconductor film by a sputtering method. The oxide semiconductor film can be formed by a sputtering method in a rare gas (typically argon) atmosphere, an oxygen atmosphere, or a mixed atmosphere of a rare gas and oxygen.

As a target used for forming an In—Ga—Zn-based metal oxide film as the oxide semiconductor film by a sputtering method, for example, a metal oxide target with an atomic ratio where In:Ga:Zn=1:1:1, a metal oxide target with an atomic ratio where In:Ga:Zn=3:1:2, or a metal oxide target with an atomic ratio where In:Ga:Zn=2:1:3 can be used. However, a material and composition of a target used for formation of the oxide semiconductor film is not limited to the above.

Further, when the oxide semiconductor film is formed using the above metal oxide target, the composition of the target is different from the composition of a film formed over the substrate in some cases. For example, when the metal oxide target having a molar ratio where $In_2O_3$:$Ga_2O_3$:ZnO=1:1:1 is used, the composition of the thin oxide semiconductor film becomes $In_2O_3$:$Ga_2O_3$:ZnO=1:1:0.6 to 1:1:0.8 [molar ratio] in some cases, though it depends on the film formation conditions. This is because in formation of the oxide semiconductor film, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition of the thin oxide semiconductor film be $In_2O_3$:$Ga_2O_3$:ZnO=1:1:1 [molar ratio], the composition of the metal oxide target is made to be $In_2O_3$:$Ga_2O_3$:ZnO=1:1:1.5 [molar ratio], for instance. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is 90% to 100% inclusive, preferably, 95% to 99.9% inclusive. By using the metal oxide target with high relative density, a dense oxide semiconductor film can be formed.

As a sputtering gas used for forming the oxide semiconductor film, it is preferable to use a high-purity gas from which impurities such as hydrogen or water are removed.

There are three methods for forming a CAAC-OS film when the CAAC-OS film is used as the oxide semiconductor film. The first method is to form an oxide semiconductor film at a temperature higher than or equal to 200° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film. The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

By heating the substrate during the film formation, the concentration of an impurity such as hydrogen or water in the oxide semiconductor film formed can be reduced. In addition, damage by sputtering can be reduced, which is preferable. The oxide semiconductor film may be formed by an ALD (atomic layer deposition) method, an evaporation method, a coating method, or the like.

Note that when a crystalline (single-crystal or microcrystalline) oxide semiconductor film other than a CAAC-OS film is formed as the oxide semiconductor film, the film formation temperature and the temperature of heat treatment are not particularly limited.

As a method for processing the oxide semiconductor film, a wet etching method or a dry etching method can be used to etch the oxide semiconductor film. An etching gas such as $BCl_3$, $Cl_2$, or $O_2$ can be used in the dry etching method. Further, a dry etching apparatus using a high-density plasma source such as electron cyclotron resonance (ECR) or inductive coupled plasma (ICP) can be used to improve an etching rate.

After the oxide semiconductor film is formed, the oxide semiconductor film may be subjected to heat treatment. The temperature of the heat treatment is higher than or equal to 300° C. and lower than or equal to 700° C., or lower than the strain point of the substrate. Through the heat treatment, excess hydrogen, water, and the like which are contained in the oxide semiconductor film can be removed. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for one hour. The oxide semiconductor film is not exposed to the air during the heat treatment so that entry of an impurity such as hydrogen or water can be prevented.

Note that a heat treatment apparatus is not limited to an electric furnace, and may include a device for heating an object to be processed by heat conduction or heat radiation from a medium such as a heated gas. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, GRTA treatment may be performed as follows. An object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process.

Note that as the inert gas atmosphere, an atmosphere that contains nitrogen or a rare gas (e.g., helium, neon, or argon) as its main component and does not contain hydrogen, water, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

The dehydration treatment (dehydrogenation treatment) might be accompanied by elimination of oxygen which is a main constituent material for an oxide semiconductor film to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy. Therefore, in the case where the dehydration treatment (dehydrogenation treatment) is performed, oxygen is preferably supplied to the oxide semiconductor film. By supply of oxygen to the oxide semiconductor film, an oxygen vacancy in the film can be repaired.

The oxygen vacancy in the second oxide semiconductor film is compensated as follows, for example: after the oxide semiconductor film is subjected to the dehydration treatment (dehydrogenation treatment), a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) is introduced into the same furnace. It is preferable that hydrogen, water, or the like be not contained in the oxygen gas or the dinitrogen monoxide gas. The purity of the oxygen gas or the dinitrogen monoxide gas which is introduced into the heat treatment apparatus is preferably 6N (99.9999%) or more, further preferably 7N (99.99999%) or more (i.e., the impurity concentration in the oxygen gas or the dinitrogen monoxide gas is preferably less than or equal to 1 ppm, further preferably less than or equal to 0.1 ppm).

As an example of a method of supplying oxygen to the oxide semiconductor film, oxygen (including at least any one of oxygen radicals, oxygen atoms, and oxygen ions) is added to the oxide semiconductor film in order to supply oxygen to the oxide semiconductor film. An ion implantation method, an ion doping method, plasma treatment, or the like can be used as a method for adding oxygen.

As another example of a method for supplying oxygen to the oxide semiconductor film, oxygen may be supplied to the oxide semiconductor film in such a manner that the base insulating film, the gate insulating film, or the like is heated and part of oxygen is released.

As described above, after formation of the oxide semiconductor film, it is preferable that dehydration treatment (dehydrogenation treatment) be performed to remove hydrogen or water from the oxide semiconductor film, so that the oxide semiconductor film is highly purified so as to include as few impurities as possible, and oxygen whose amount is reduced in the dehydration treatment (dehydrogenation treatment) be added to the oxide semiconductor or oxygen be supplied excessively to fill the oxygen vacancies in the oxide semiconductor film. Further, supplying oxygen to the oxide semiconductor film may be expressed as oxygen adding treatment or treatment for making an oxygen-excess state.

In this manner, hydrogen, water, or the like is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. Specifically, the concentration of hydrogen in the oxide semiconductor film is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$. Note that the concentration of hydrogen in the oxide semiconductor film is measured by secondary ion mass spectrometry (SIMS).

The number of carriers generated due to a donor in the oxide semiconductor film, in which hydrogen concentration is reduced to a sufficiently low so that the oxide semiconductor film is purified and in which defect states in a band gap due to oxygen deficiency are reduced by sufficiently supplying oxygen as described above, is very small (close to zero); carrier concentration is less than $1\times10^{12}$/cm$^3$, preferably less than $1\times10^{11}$/cm$^3$, more preferably less than $1.45\times10^{10}$/cm$^3$. In a transistor including such an oxide semiconductor film, the off-state current (per unit channel width (1 µm) here) at room temperature (25° C.), for example, is less than or equal to 100 zA (1 zA (zeptoampere) is $1\times10^{-21}$ A), preferably less than or equal to 10 zA, more preferably less than or equal to 100 yA (1 yA (yoctoampere) is $1\times10^{-24}$ A). The transistor with very excellent off-state current characteristics can be obtained with the use of such an i-type (intrinsic) or substantially i-type oxide semiconductor.

⟨Method for Manufacturing Transistor⟩

Figure 3A:
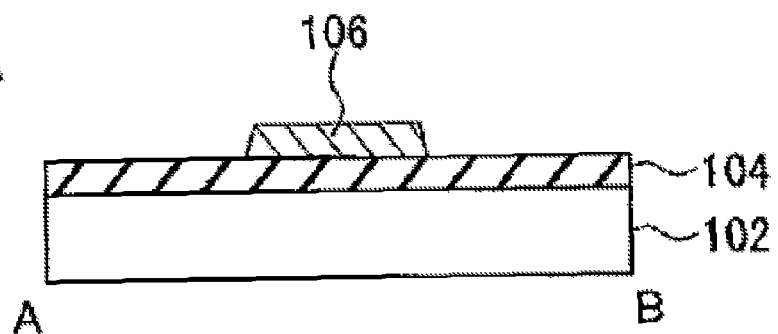
FIGS. 3A to 3C are cross-sectional views illustrating a method for manufacturing the semiconductor device shown in FIGS. 1A and 1B.

Next, a method for manufacturing the semiconductor device illustrated in FIGS. 1A and 1B will be described with reference to FIGS. 3A to 3C. Note that portions similar to those in FIGS. 1A and 1B are denoted by the same reference numerals, and description thereof is skipped.

First, the base insulating film 104 is formed over the substrate 102. Next, after a conductive film is formed over the base insulating film 104, the gate electrode 106 is formed through a photolithography process and an etching process (see FIG. 3A).

For the substrate 102, a glass material such as aluminosilicate glass, aluminoborosilicate glass, or barium borosilicate glass is used. In the mass production, a mother glass with the following size is preferably used for the substrate 102: the 8-th generation (2160 mm×2460 mm); the 9-th generation (2400 mm×2800 mm, or 2450 mm×3050 mm); the 10-th generation (2950 mm×3400 mm); or the like. A mother glass considerably shrinks when the treatment temperature is high and the treatment time is long. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

The base insulating film 104 can be formed by, for example, a CVD method, a sputtering method, or the like, using silicon oxide, gallium oxide, aluminum oxide, silicon nitride, silicon oxynitride, aluminum oxynitride, silicon nitride oxide, or the like. With the use of the above-described silicon nitride film or aluminum oxide film as the base insulating film 104, an impurity can be prevented from being diffused from the substrate 102 into the transistor 150. Note that the base insulating film 104 may be provided as needed.

The gate electrode 106 can be formed by a sputtering method or the like to have a single-layer structure or a stacked-layer structure using a metal material such as molybdenum, titanium, tantalum, tungsten, aluminum, copper, neodymium, or scandium, or an alloy material containing at least any one of these materials.

Figure 3B:
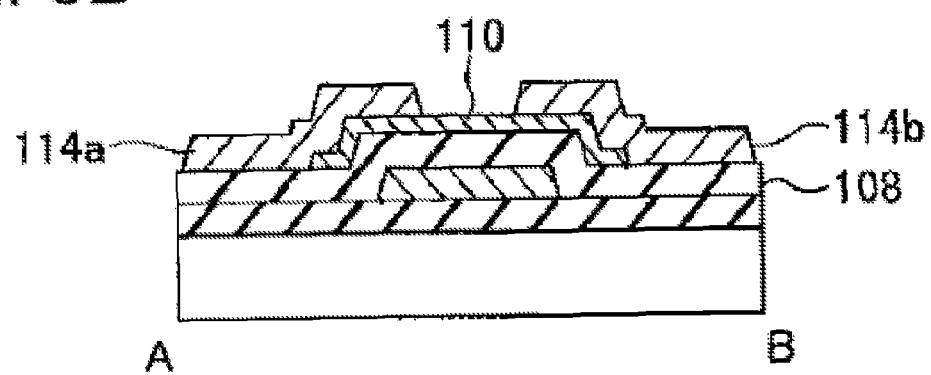

After that, the gate insulating film 108 is provided over the base insulating film 104 and the gate electrode 106 (see FIG. 3B).

The gate insulating film 108 can be formed by, for example, using silicon oxide, gallium oxide, aluminum oxide, silicon nitride, silicon oxynitride, aluminum oxynitride, silicon nitride oxide, or the like. The thickness of the gate insulating film 108 can be, for example, greater than or equal to 10 nm and less than or equal to 500 nm, preferably greater than or equal to 50 nm and less than or equal to 300 nm.

It is preferable that the gate insulating film 108 contain oxygen in a portion which is in contact with the oxide semiconductor film 110 to be formed later. In particular, the gate insulating film 108 preferably contains oxygen at an amount which exceeds at least the stoichiometric composition. For example, in the case where silicon oxide is used for the gate insulating film 108, the composition formula is preferably $SiO_{2+\alpha}$ ($\alpha>0$). In this embodiment, silicon oxide of $SiO_{2+\alpha}$ ($\alpha>0$) is used for the gate insulating film 108. With the use of the silicon oxide for the gate insulating film 108, oxygen can be supplied to the oxide semiconductor film 110 to be formed later and the oxide semiconductor film 110 can have excellent electrical characteristics.

The gate insulating film 108 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide. By using such a material, gate leakage current can be reduced. Further, the gate insulating film 108 may have a single-layer structure or a stacked-layer structure.

Next, heat treatment may be performed on the substrate 102 provided with the gate insulating film 108.

The heat treatment can be performed using an electric furnace or a device for heating an object by heat conduction or heat radiation from a heating element such as a resistance heating element. The heat treatment apparatus described in "Detailed Description of Oxide Semiconductor Film 110" can be used as appropriate. As the high-temperature gas in the GRTA apparatus, an inert gas which does not react by a heat treatment with an object to be processed, such as nitrogen or a rare gas like argon, is used. Alternatively, oxygen may be used as another high-temperature gas. When oxygen is used, release of oxygen from the gate insulating film 108 can be inhibited or supply of oxygen to the gate insulating film 108 can be performed.

In the case where the mother glass is used as the substrate 102, high process temperature and a long period of process time drastically shrink the mother glass; therefore, the process temperature of the heat treatment is preferably higher than or equal to 200° C. and lower than or equal to 450° C., more preferably higher than or equal to 250° C. and lower than or equal to 350° C.

An impurity such as hydrogen or water in the gate insulating film 108 can be removed by the heat treatment. Further, by the heat treatment, the defect density in the gate insulating film 108 can be reduced. The reduction of the impurity such as hydrogen or water in the gate insulating film 108 or the defect density in the film leads to improvement in reliability of the semiconductor device. For example, degradation of the semiconductor device during a negative bias stress test with light irradiation, which is one of the reliability tests for semiconductor devices, can be suppressed.

The heat treatment may be performed as pretreatment for formation of the oxide semiconductor film 110 to be formed later. For example, after the gate insulating film 108 is formed, heat treatment is performed in a vacuum in a preheating chamber of a sputtering apparatus and the oxide semiconductor film 110 is then formed.

Furthermore, the heat treatment may be performed more than once. For example, after the gate insulating film 108 is formed, heat treatment is performed in a nitrogen atmosphere with an electric furnace or the like; then, after heat treatment is performed in a vacuum in a preheating chamber of a sputtering apparatus, the oxide semiconductor film 110 is then formed.

Next, an oxide semiconductor film is formed over the gate insulating film 108, and a photolithography process and an etching process are performed; thus, the oxide semiconductor film 110 that is isolated by element separation is formed (see FIG. 3B). At this time, the side surface of the oxide semiconductor film 110 which overlaps with the gate electrode 106 has at least one of a corrugated side surface, a waved side surface, a jagged side surface, and a side surface where a projected portion and a depressed portion are alternately arranged. In order to form such a side surface, the shape of a photoresist film is controlled so that the side surface after the etching process has such a side surface. In this manner, the first and the second high resistance regions are formed in the side surfaces of the oxide semiconductor film 110 which overlap with the gate electrode 106.

Note that detailed description of the oxide semiconductor film 110, a method for manufacturing the oxide semiconductor film 110, and the like is omitted here since it is already mentioned in "Detailed Description of Oxide Semiconductor Film 110".

A conductive film is formed over the gate insulating film 108 and the oxide semiconductor film 110 and is subjected to a photolithography process and an etching process, whereby the source electrode 114a and the drain electrode 114b which are electrically connected to the oxide semiconductor film 110 are formed. At this stage, the transistor 150 is formed (see FIG. 3B).

As the conductive film used for the source electrode 114a and the drain electrode 114b, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used to have a single-layer structure or a stacked-layer structure. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like.

Figure 3C:
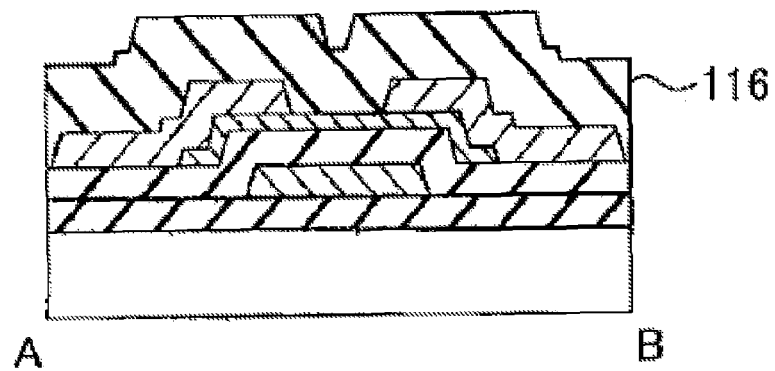

Next, the interlayer insulating film 116 and the planarization insulating film (not shown) are formed over the transistor 150 (see FIG. 3C).

The interlayer insulating film 116 can be formed using a material and a method which are the same or substantially the same those of the gate insulating film 108.

As the planarization insulating film, for example, an organic resin material such as a polyimide-based resin, an acrylic-based resin, or a benzocyclobutene-based resin can be used. With the planarization insulating film, the surface of the transistor 150 can be flat.

Further, a conductive film (not shown) may be formed over the planarization insulating film. For the conductive film, a conductive material with a light-transmitting property, for example, indium tin oxide (ITO), indium zinc oxide, or the like can be used. Note that the material of the conductive film is not limited to the above. For example, a metal film (a film of aluminum, titanium, or the like) may be used. Such a metal film is preferably used because the transistor 150 can be shielded from light.

The conductive film also has a function of shielding the transistor 150 from static charges (what is called an electrostatic discharge: ESD). With the conductive film over the transistor 150, charge due to electrostatic discharge (ESD) or the like can be dissipated.

Embodiment 2

Figure 4A:
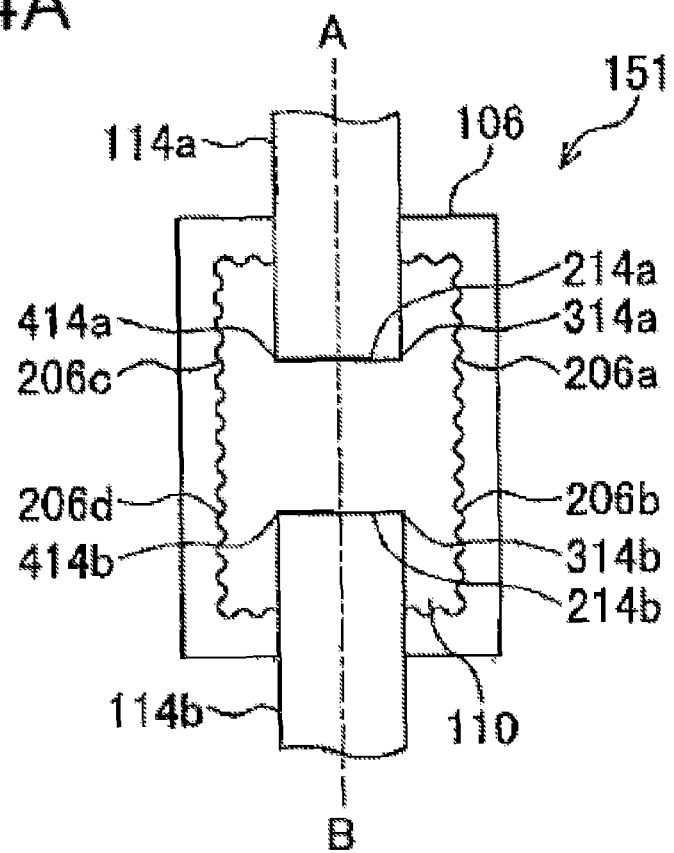
FIG. 4A is a plan view of a semiconductor device according to one embodiment of the present invention.
Figure 4B:
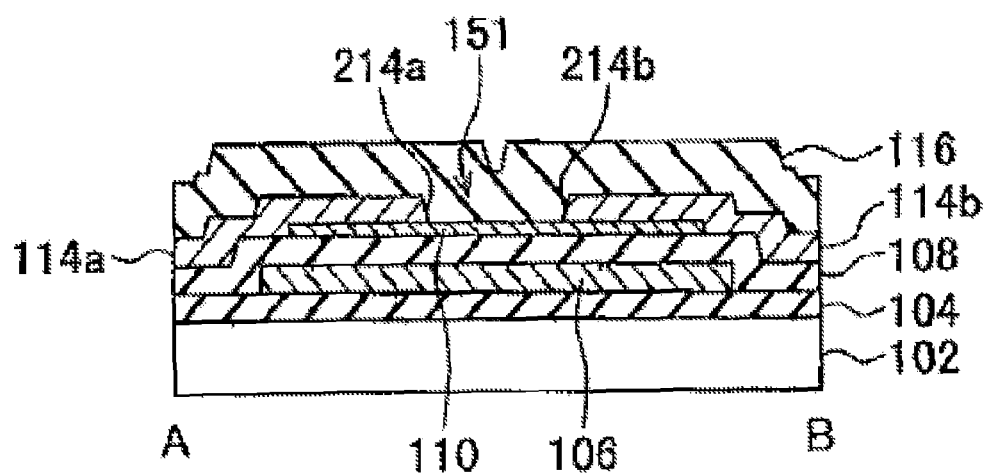
FIG. 4B is a cross-sectional view taken along line A-B shown in FIG. 4A.

FIG. 4A is a plan view of a semiconductor device according to one embodiment of the present invention. FIG. 4B is a cross-sectional view taken along line A-B shown in FIG. 4A.

The semiconductor device in this embodiment has the same structure as that in Embodiment 1 except for the following points.

In the transistor 150 described in Embodiment 1, parts of the side surfaces of the oxide semiconductor film 110 overlap with the gate electrode 106, and the first and the second high resistance regions are formed in the parts of the side surfaces of the oxide semiconductor film 110, whereas in a transistor 151 in this embodiment, the entire side surface of the oxide semiconductor film 110 overlaps with the gate electrode 106 and a high resistance region is formed in the entire side surface of the oxide semiconductor film 110. In other words, there are no side surfaces which do not overlap with the gate electrode 106, and there are no regions in the side surfaces of the oxide semiconductor film 110, where high resistance regions are not formed.

Advantageous effects similar to those obtained in Embodiment 1 can also be obtained in this embodiment.

As shown in FIG. 4A, even in the case where voltage is applied to the gate electrode 106, current is less likely to flow between the one end 314a of the first side surface 214a of the source electrode 114a and the first region 206a of the oxide semiconductor film 110 which is the nearest to the one end 314a and between the one end 314b of the second side surface 214b of the drain electrode 114b and the second region 206b of the oxide semiconductor film 110 which is the nearest to the one end 314b. In a similar manner, current is less likely to flow between the other end 414a of the first side surface 214a of the source electrode 114a and the third region 206c of the oxide semiconductor film 110 which is the nearest to the other end 414a and between the other end 414b of the second side surface 214b of the drain electrode 114b and the fourth region 206d of the oxide semiconductor film 110 which is the nearest to the other end 414b. Thus, parasitic channel can be prevented from occurring on the side surfaces of the oxide semiconductor film 110.

The method for manufacturing the semiconductor device shown in FIGS. 4A and 4B is the same as that described in Embodiment 1; thus the description thereof is omitted.

Embodiment 3

Figure 5A:
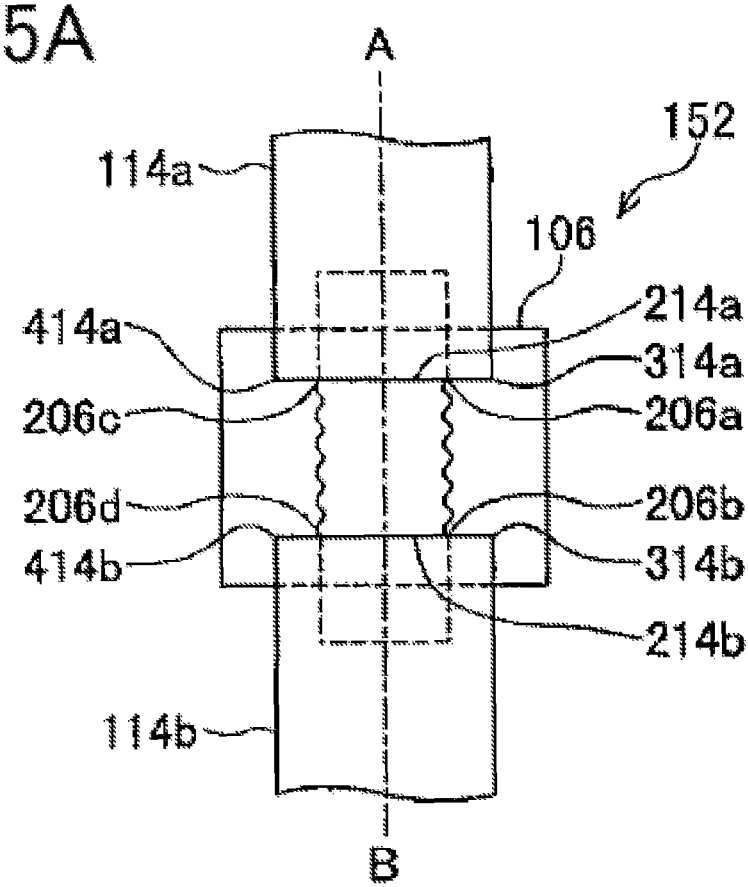
FIG. 5A is a plan view of a semiconductor device according to one embodiment of the present invention.
Figure 5B:
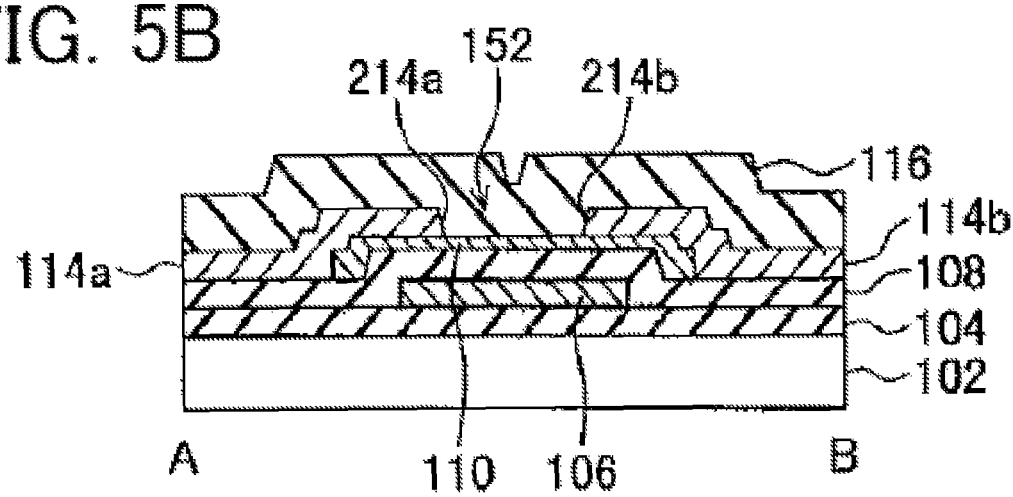
FIG. 5B is a cross-sectional view taken along line A-B shown in FIG. 5A.

FIG. 5A is a plan view showing a semiconductor device according to one embodiment of the present invention, and FIG. 5B is a cross-sectional view taken along line A-B shown in FIG. 5A.

The semiconductor device in this embodiment has the same structure as that in Embodiment 1 except for the following points.

In the transistor 150 described in Embodiment 1, the oxide semiconductor film 110 whose width is larger than the width of each of the source electrode 114a and the drain electrode 114b is formed, whereas in a transistor 152 in this embodiment, the oxide semiconductor film 110 whose width is smaller than the width of each of the source electrode 114a and the drain electrode 114b is formed.

Advantageous effects similar to those obtained in Embodiment 1 can also be obtained in this embodiment.

Specifically, as shown in FIG. 5A, current is less likely to flow between the first region 206a of the oxide semiconductor film 110 which is the nearest to the one end 314a of the first side surface 214a of the source electrode 114a (in other words, the nearest to the first side surface 214a) and the second region 206b of the oxide semiconductor film 110 which is the nearest to the one end 314b of the second side surface 214b of the drain electrode 114b (in other words, the nearest to the second side surface 214b). In a similar manner, current is less likely to flow between the third region 206c of the oxide semiconductor film 110 which is the nearest to the other end 414a of the first side surface 214a of the source electrode 114a (in other words, the nearest to the first side surface 214a) and the fourth region 206d of the oxide semiconductor film 110 which is the nearest to the other end 414b of the second side surface 214b of the drain electrode 114b (in other words, the nearest to the second side surface 214b). Thus, parasitic channel can be prevented from occurring on the side surfaces of the oxide semiconductor film 110.

The method for manufacturing the semiconductor device shown in FIGS. 5A and 5B is the same as that described in Embodiment 1; thus the description thereof is omitted.

⟨Simulation Results⟩

Description is made on simulations performed on transistor characteristics at the time when an end region of the oxide semiconductor film has become n-type.

Figure 6A:
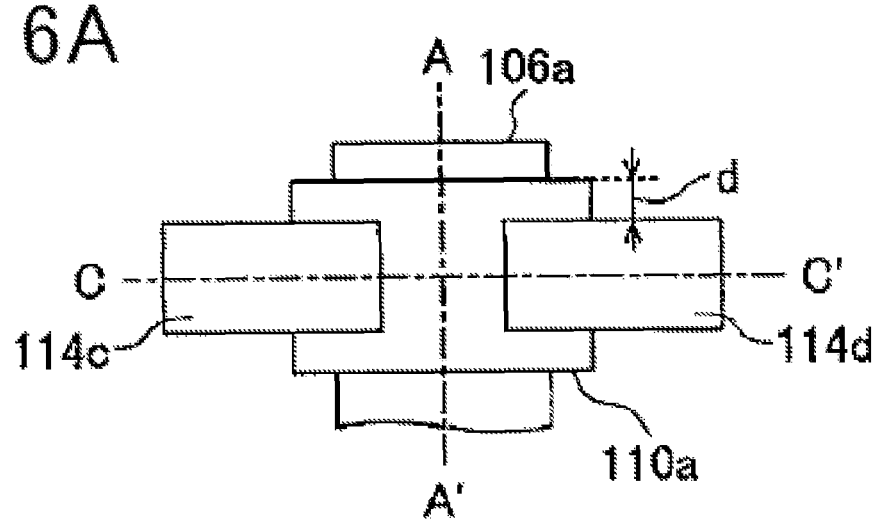
FIG. 6A is a plan view of a transistor that is a simulation object.
Figure 6B:
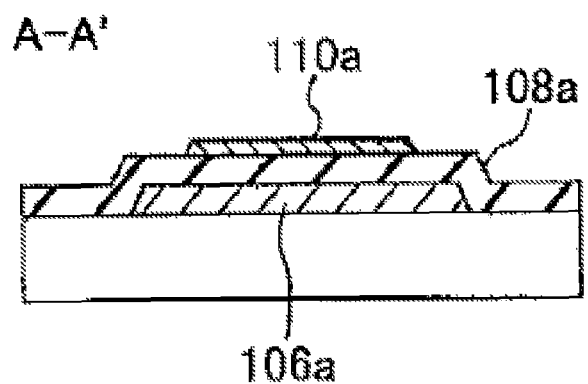
FIG. 6B is a cross-sectional view taken along line A-A' shown in FIG. 6A.
Figure 6C:
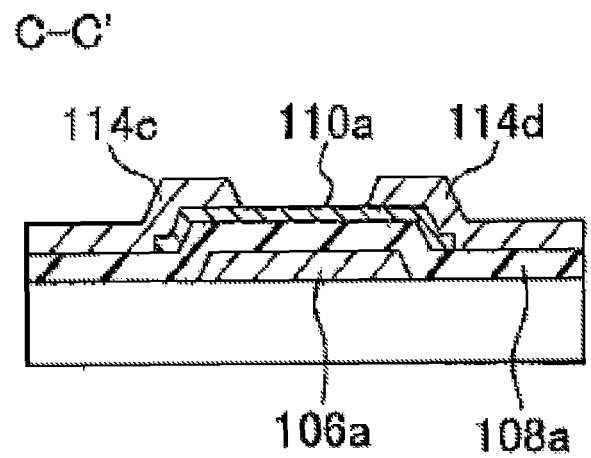
FIG. 6C is a cross-sectional view taken along line C-C' shown in FIG. 6A.

FIG. 6A is a plan view of a transistor that is a simulation object. FIG. 6B is a cross-sectional view taken along line A-A' shown in FIG. 6A. FIG. 6C is a cross-sectional view taken along line C-C' shown in FIG. 6A.

As shown in FIGS. 6A to 6C, a gate insulating film 108a is formed over the gate electrode 106a, and an oxide semiconductor film 110a using IGZO as an active layer is formed over the gate insulating film 108a. A source electrode 114c and a drain electrode 114d are formed over the oxide semiconductor film 110a.

The width of a side of the oxide semiconductor film 110a, which extends beyond the source electrode 114c or the drain electrode 114d, is denoted d; the thickness of the oxide semiconductor film 110a is set to 20 nm; and the thickness of the gate insulating film 108a is set to 100 nm.

Figure 7A:
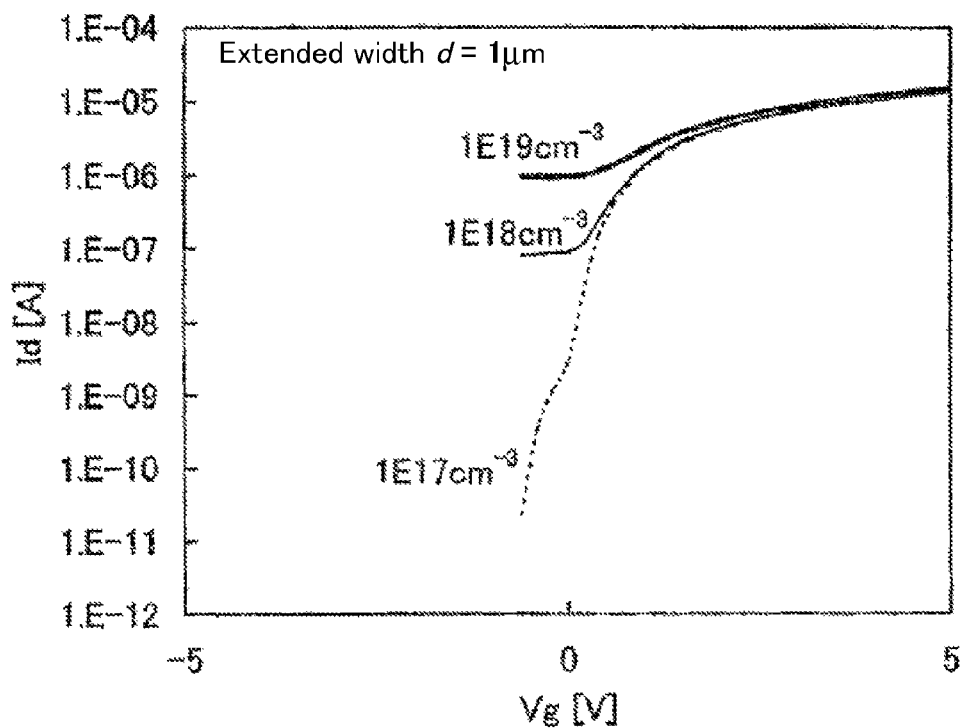
FIG. 7A shows results of a first simulation and FIG. 7B shows results of a second simulation.

FIG. 7A shows the first simulation results. The first simulation was performed in the following conditions: the gate length L, the gate width W, and the extended width d were fixed to 6 μm, 50 μm, and 1 μm, respectively; the carrier density in the entire end region of the oxide semiconductor film 110a was changed in the range of $1 \times 10^{17}$ cm$^{-3}$ to $1 \times 10^{19}$ cm$^{-3}$; and the drain voltage Vd was set to 1V. In FIG. 7A, the broken line, the thin solid line, and the thick solid line represent Id-Vg curves with $1 \times 10^{17}$ cm$^{-3}$, $1 \times 10^{18}$ cm$^{-3}$, and $1 \times 10^{19}$ cm$^{-3}$, respectively as the carrier densities in the end region.

Figure 7B:
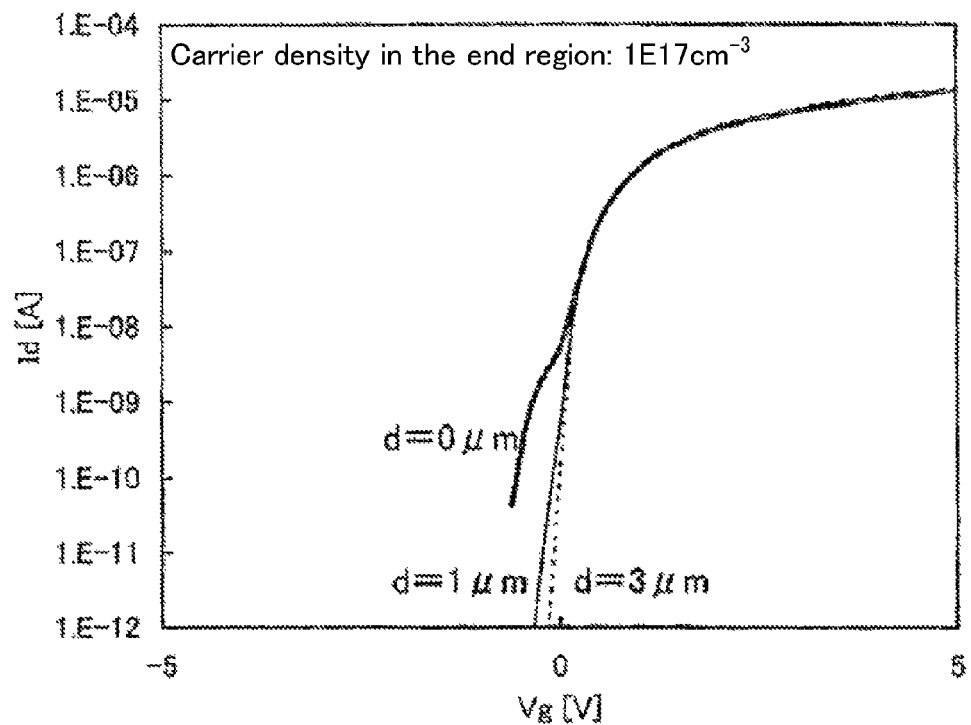

FIG. 7B shows a second simulation results. The second simulation was performed in the following condition: the gate length L, the gate width W, and the carrier density in the oxide semiconductor film 110a were fixed to 6 μm, 50 μm, and $1 \times 10^{17}$ cm$^{-3}$, respectively; the extended width d was changed in the range of 0 to 3 μm; and the drain voltage Vd was set to 1V. In FIG. 7B, the broken line, the thin solid line, and the thick solid line represent Id-Vg curves at the time when the extended width d are 3 μm, 1 μm, and 0 μm, respectively.

As shown in FIG. 7A, the higher the carrier density at the end region of the oxide semiconductor film 110a, the larger the hump generated in the Id-Vg curve. Further, as shown in FIG. 7B, the larger the extended width d, the smaller the hump generated in the Id-Vg curves.

Embodiment 4

⟨Liquid Crystal Display Device⟩

Figure 8:
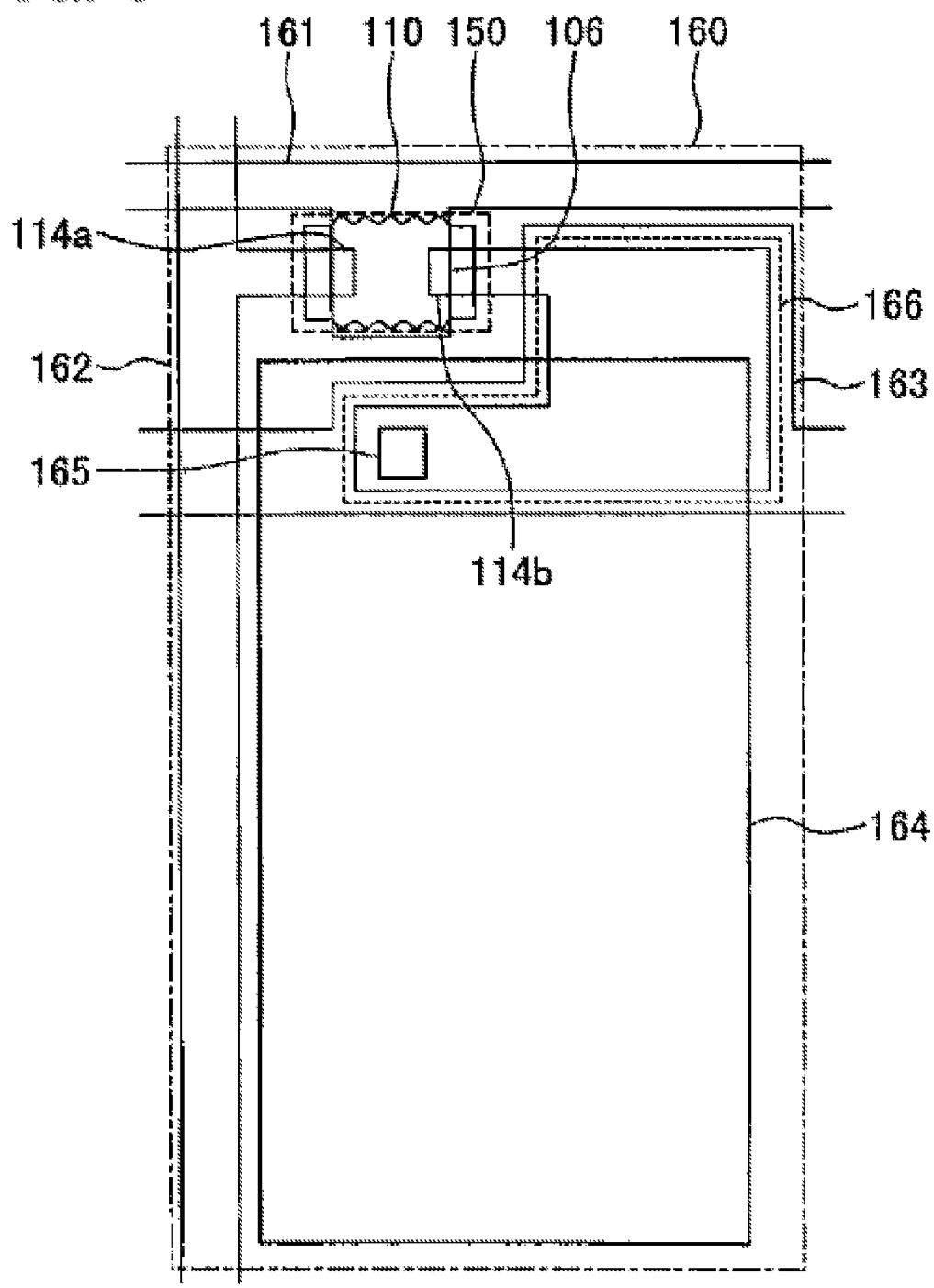
FIG. 8 is a top view of a pixel of a liquid crystal display device according to one embodiment of the present invention.
Figure 9:
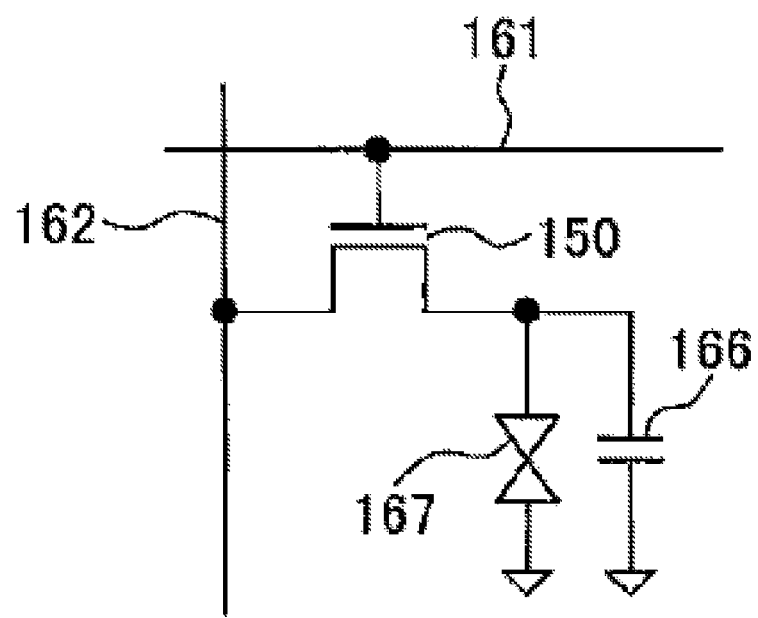
FIG. 9 is a circuit diagram of the pixel of the liquid crystal display device shown in FIG. 8.

FIG. 8 is a top view illustrating a pixel of a liquid crystal display device of one embodiment of the present invention. FIG. 9 is a circuit diagram of the pixel of the liquid crystal display device shown in FIG. 8.

As shown in FIGS. 8 and 9, the liquid crystal display device includes a pixel 160, and the pixel 160 includes the transistor 150 shown in FIGS. 1A and 1B. Note that the transistor 150 shown in FIGS. 1A and 1B is used in this embodiment; however, the transistor 151 shown in FIGS. 4A and 4B or the transistor 152 shown in FIGS. 5A and 5B may be used.

The circuit diagram of the pixel 160 of the liquid crystal display device shown in FIG. 8 will be described with reference to FIG. 9. A gate electrode of the transistor 150 is connected to a scanning line 161, one of a source electrode and a drain electrode of the transistor 150 is connected to a signal line 162, and the other of the source electrode and the drain electrode is connected to a capacitor 166 and a liquid crystal element 167.

The pixel 160 will be described in detail with reference to FIG. 8. The gate electrode 106 of the transistor 150 is connected to the scanning line 161; the source electrode 114a of the transistor 150 is connected to the signal line 162; and the drain electrode 114b of the transistor 150 is connected to the liquid crystal element 167 and the capacitor 166. Specifically, the drain electrode 114b of the transistor 150 is connected to a capacitor wiring 163, and is electrically connected to a pixel electrode 164 in a contact hole 165 through the capacitor wiring 163. The liquid crystal element 167 in FIG. 9 includes the pixel electrode 164, and a liquid crystal material and a counter electrode which are not shown in the figure. In FIG. 8, the gate electrode 106 and the scanning line 161 are formed using the same layer and connected to each other; however, they may be formed using different layers and connected to each other, the source electrode 114a and the signal line 162 are formed using the same layer and connected to each other; however, they may be formed using different layers and connected to each other, and the drain electrode 114b and the capacitor wiring 163 are formed using the same layer and are connected to each other; however, they may be formed using different layers and connected to each other.

According to this embodiment, with the use of the transistor 150 shown in FIGS. 1A and 1B, the adverse effects that voltage in the pixel 160 of the liquid crystal display device cannot be retained, current consumption is increased, and the like can be reduced.

Embodiment 5

⟨EL Display Device⟩

Figure 10:
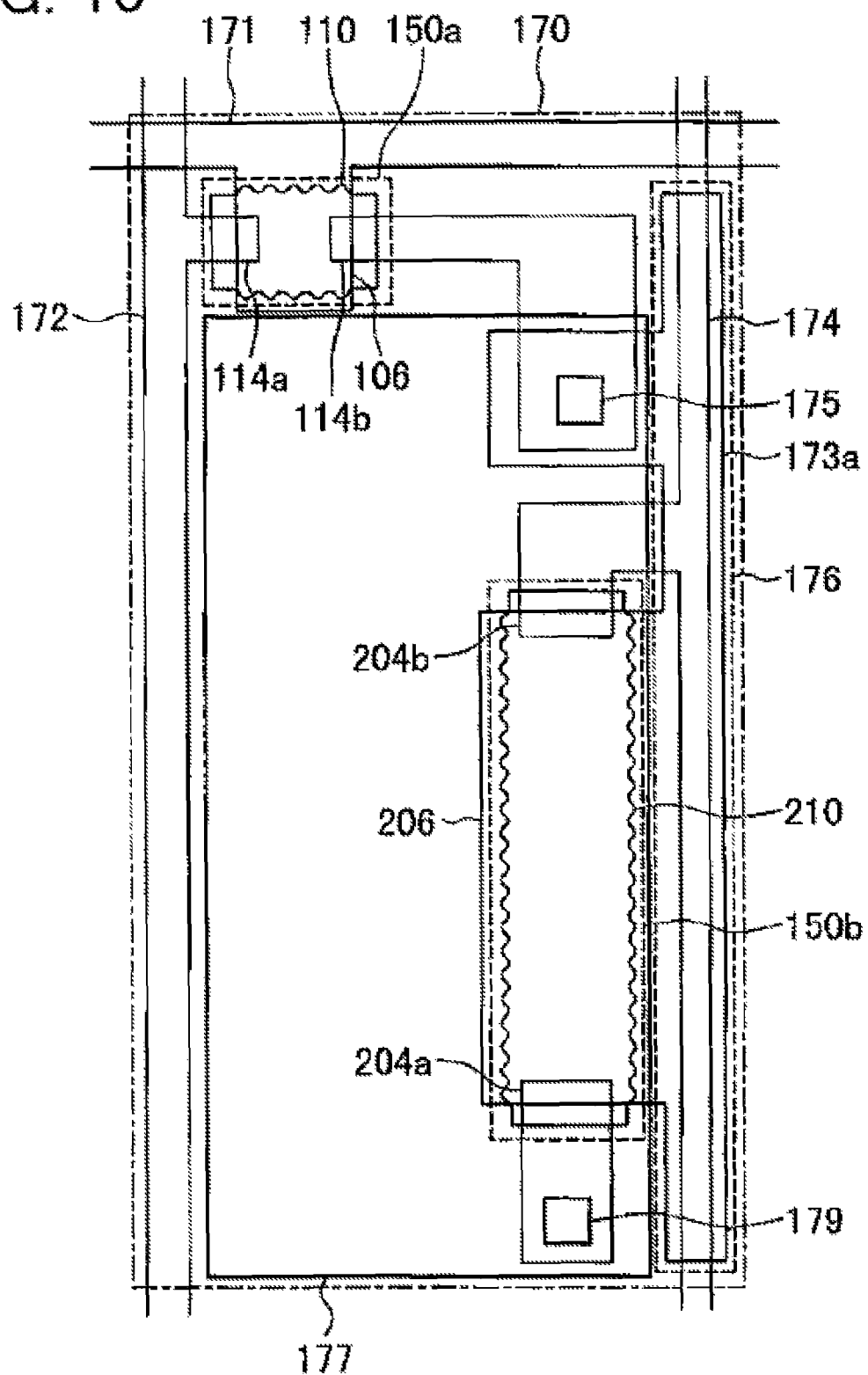
FIG. 10 is a top view of a pixel of an EL display device according to one embodiment of the present invention.
Figure 11:
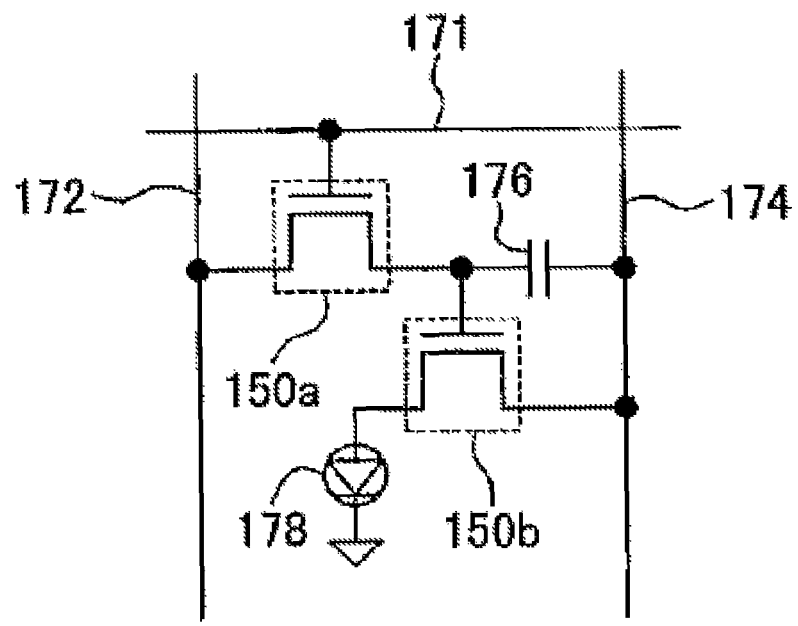
FIG. 11 is a circuit diagram of the pixel of the EL display device shown in FIG. 10.
Figure 12:
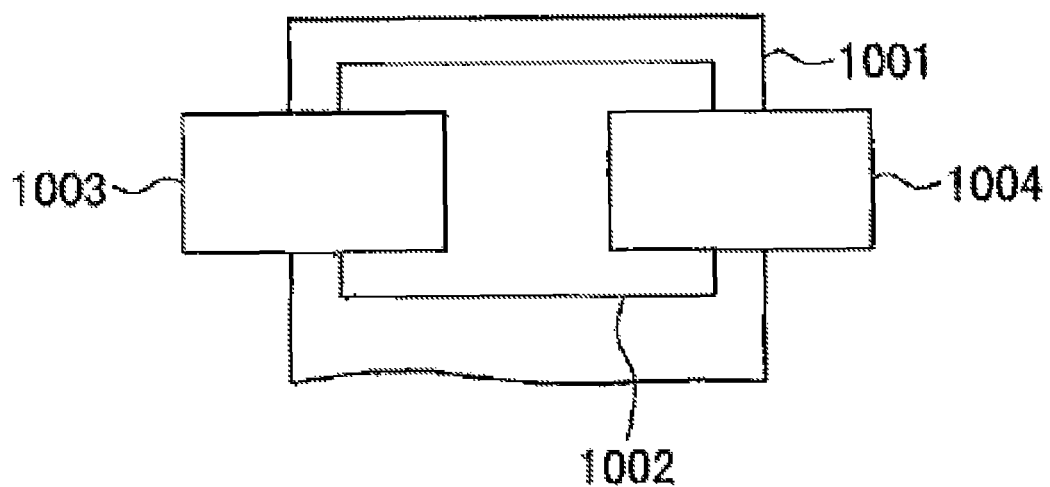
FIG. 12 is a top view of a bottom gate transistor in which IGZO (In—Ga—Zn—O) is used as an oxide semiconductor.
Figure 13:
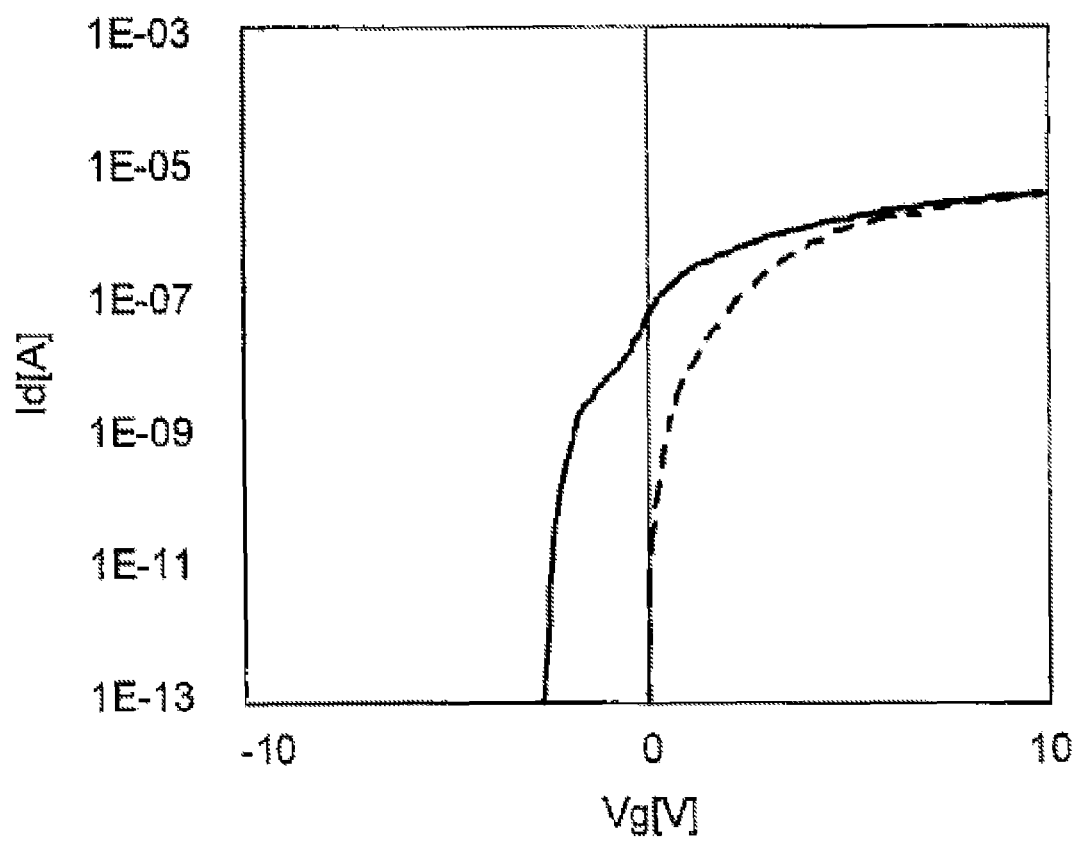
FIG. 13 shows Id-Vg curves that are the results of the GBT stress test of the transistor shown in FIG. 12.

FIG. 10 is a top view illustrating a pixel of an EL display device of one embodiment of the present invention. FIG. 11 is a circuit diagram of the pixel of the EL display device shown in FIG. 10.

As shown in FIG. 10 and FIG. 11, the EL display device includes a pixel 170, and the pixel 170 includes a selection transistor 150a and a driving transistor 150b. The transistor 150 shown in FIGS. 1A and 1B are used as each of the selection transistor 150a and the driving transistor 150b. Note that in this embodiment, the transistor 150 shown in FIGS. 1A and 1B is used as each of the selection transistor 150a and the driving transistor 150b; however, the transistor 151 shown in FIGS. 4A and 4B or the transistor 152 shown in FIGS. 5A and 5B may be used.

The circuit diagram of the pixel 170 of the EL display device shown in FIG. 10 will be described with reference to FIG. 11. A gate electrode of the selection transistor 150a is connected to a scanning line 171; one of a source electrode and a drain electrode of the selection transistor 150a is connected to a signal line 172; the other of the source electrode and the drain electrode of the selection transistor 150a is connected to a gate electrode of the driving transistor 150b and one electrode of a capacitor 176. One of a source electrode and a drain electrode of the driving transistor 150b is connected to a power supply line 174, and the other of the source electrode and the drain electrode of the driving transistor 150b is connected to a light-emitting element 178. The other electrode of the capacitor 176 is connected to the power supply line 174.

Next, the pixel 170 will be described in detail with reference to FIG. 10. The gate electrode 106 of the selection transistor 150a is connected to the scanning line 171, and the source electrode 114a of the selection transistor 150a is connected to the signal line 172. The drain electrode 114b of the selection transistor 150a is electrically connected to one capacitor electrode 173a of the capacitor 176 through a contact hole 175, and the capacitor electrode 173a is connected to a gate electrode 206 of the driving transistor 150b. An oxide semiconductor film 210 is provided over the gate electrode 206 with the gate insulating film interposed therebetween. Part of the power supply line 174 serves as the other capacitor electrode of the capacitor 176, and the power supply line 174 is connected to a drain electrode 204b of the driving transistor 150b. A source electrode 204a of the driving transistor 150b is electrically connected to a first electrode 177 of the light-emitting element through a contact hole 179. The light-emitting element 178 shown in FIG. 11 includes the first electrode 177, and the light-emitting layer and the second electrode which are not shown in the figure. Note that in FIG. 10, the gate electrode 106 and the scanning line 171 are formed using the same layer and connected to each other; however, they may be formed using different layers and connected to each other, the source electrode 114a and the signal line 172 are formed using the same layer and connected to each other; however, they may be formed using different layers and connected to each other, and the capacitor electrode 173a and the gate electrode 206 are formed using the same layer and are connected to each other; however, they may be formed using different layers and connected to each other.

According to this embodiment, with the use of the transistor 150 shown in FIGS. 1A and 1B, the adverse effects that voltage in the pixel 170 of the EL display device cannot be retained, current consumption is increased, and the like can be reduced This application is based on Japanese Patent Application serial no. 2012-093513 filed with Japan Patent Office on Apr. 17, 2012, the entire contents of which are hereby incorporated by reference.

What is claimed is:

1. A semiconductor device comprising:
   a gate electrode;
   a gate insulating film over the gate electrode; and
   an oxide semiconductor film over the gate insulating film,
      wherein the oxide semiconductor film overlaps with the gate electrode,
   wherein the oxide semiconductor film comprises a side surface which overlaps with the gate electrode, and
   wherein at least part of the side surface comprises an uneven shape.

2. The semiconductor device according to claim 1,
   wherein the whole of the side surface of the oxide semiconductor film is a high resistance region, and
   wherein the high resistance region comprises at least one of a corrugated side surface, a waved side surface, a jagged side surface, and a side surface where a projected portion and a depressed portion are alternately arranged.

3. The semiconductor device according to claim 1,
   wherein the oxide semiconductor film is a film comprising an oxide of one or more elements selected from indium, zinc, gallium, and tin.

4. The semiconductor device according to claim 1,
   wherein the oxide semiconductor film comprises a crystal portion where a c-axis is aligned in a direction parallel to a normal vector of a surface where the oxide semiconductor film is formed.

5. A semiconductor device comprising:
   a gate electrode;
   an oxide semiconductor film comprising a channel region; and
   a source electrode and a drain electrode,
   wherein the channel region is positioned between a first side surface of the source electrode and a second side surface of the drain electrode opposite to the first side surface,
   wherein the oxide semiconductor film comprises a side surface which overlaps with the gate electrode,
   wherein the side surface of the oxide semiconductor film comprises a first high resistance region positioned between a first region nearest to one end of the first side surface and a second region nearest to one end of the second side surface, and
   wherein the first high resistance region comprises at least one of a corrugated side surface, a waved side surface, a jagged side surface, and a side surface where a projected portion and a depressed portion are alternately arranged.

6. The semiconductor device according to claim 5,
   wherein the side surface of the oxide semiconductor film comprises a second high resistance region positioned between a third region nearest to the other end of the first side surface and a fourth region nearest to the other end of the second side surface, and
   wherein the second high resistance region comprises at least one of a corrugated side surface, a waved side surface, a jagged side surface, and a side surface where a projected portion and a depressed portion are alternately arranged.

7. The semiconductor device according to claim 5,
wherein the first high resistance region is continuous from the first region to the second region.

8. The semiconductor device according to claim 6,
wherein the second high resistance region is continuous from the third region to the fourth region.

9. The semiconductor device according to claim 5,
wherein the whole of the side surface of the oxide semiconductor film is a high resistance region, and
wherein the high resistance region comprises at least one of a corrugated side surface, a waved side surface, a jagged side surface, and a side surface where a projected portion and a depressed portion are alternately arranged.

10. The semiconductor device according to claim 5,
wherein the oxide semiconductor film is a film comprising an oxide of one or more elements selected from indium, zinc, gallium, and tin.

11. The semiconductor device according to claim 5,
wherein the oxide semiconductor film comprises a crystal portion where a c-axis is aligned in a direction parallel to a normal vector of a surface where the oxide semiconductor film is formed.

12. A semiconductor device comprising:
a gate electrode;
a gate insulating film over the gate electrode;
an oxide semiconductor film over the gate insulating film, the oxide semiconductor film comprising a channel region; and
a source electrode and a drain electrode each electrically connected to the oxide semiconductor film,
wherein the channel region is positioned between a first side surface of the source electrode and a second side surface of the drain electrode opposite to the first side surface,
wherein the oxide semiconductor film comprises a side surface which overlaps with the gate electrode,
wherein the side surface of the oxide semiconductor film comprises a first high resistance region positioned between a first region nearest to one end of the first side surface and a second region nearest to one end of the second side surface, and
wherein the first high resistance region comprises at least one of a corrugated side surface, a waved side surface, a jagged side surface, and a side surface where a projected portion and a depressed portion are alternately arranged.

13. The semiconductor device according to claim 12,
wherein the side surface of the oxide semiconductor film comprises a second high resistance region positioned between a third region nearest to the other end of the first side surface and a fourth region nearest to the other end of the second side surface, and
wherein the second high resistance region comprises at least one of a corrugated side surface, a waved side surface, a jagged side surface, and a side surface where a projected portion and a depressed portion are alternately arranged.

14. The semiconductor device according to claim 12,
wherein the first high resistance region is continuous from the first region to the second region.

15. The semiconductor device according to claim 13,
wherein the second high resistance region is continuous from the third region to the fourth region.

16. The semiconductor device according to claim 12,
wherein the whole of the side surface of the oxide semiconductor film is a high resistance region, and
wherein the high resistance region comprises at least one of a corrugated side surface, a waved side surface, a jagged side surface, and a side surface where a projected portion and a depressed portion are alternately arranged.

17. The semiconductor device according to claim 12,
wherein the oxide semiconductor film is a film comprising an oxide of one or more elements selected from indium, zinc, gallium, and tin.

18. The semiconductor device according to claim 12,
wherein the oxide semiconductor film comprises a crystal portion where a c-axis is aligned in a direction parallel to a normal vector of a surface where the oxide semiconductor film is formed.

* * * * *